(12) United States Patent
Asano

(10) Patent No.: US 11,818,837 B2
(45) Date of Patent: Nov. 14, 2023

(54) CIRCUIT BOARD

(71) Applicant: CANON KABUSHIKI KAISHA, Tokyo (JP)

(72) Inventor: Kohei Asano, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/347,013

(22) Filed: Jun. 14, 2021

(65) Prior Publication Data

US 2021/0400804 A1 Dec. 23, 2021

(30) Foreign Application Priority Data

Jun. 17, 2020 (JP) ................................. 2020-104673

(51) Int. Cl.
*H05K 1/02* (2006.01)
*H05K 1/11* (2006.01)
*H05K 1/18* (2006.01)

(52) U.S. Cl.
CPC ......... *H05K 1/0271* (2013.01); *H05K 1/0298* (2013.01); *H05K 1/115* (2013.01); *H05K 1/11* (2013.01); *H05K 1/18* (2013.01); *H05K 2201/09063* (2013.01)

(58) Field of Classification Search
CPC .... H05K 1/0271; H05K 1/0298; H05K 1/115; H05K 2201/09063; H05K 1/02; H05K 2201/10409
See application file for complete search history.

(56) References Cited

U.S. PATENT DOCUMENTS

| | | | | |
|---|---|---|---|---|
| 2002/0057556 A1* | 5/2002 | Mizusaki | ............... | H05K 7/142 361/752 |
| 2002/0181191 A1* | 12/2002 | Huang | ................... | H05K 7/142 361/752 |
| 2010/0284143 A1* | 11/2010 | Lev | ....................... | H05K 1/0271 361/752 |
| 2014/0126152 A1* | 5/2014 | Yang | .................. | H01L 23/4006 361/704 |
| 2019/0254164 A1* | 8/2019 | Iwai | ..................... | H05K 1/0271 |

FOREIGN PATENT DOCUMENTS

JP 2019-179788 A 10/2019

* cited by examiner

*Primary Examiner* — Ishwarbhai B Patel
(74) *Attorney, Agent, or Firm* — Canon U.S.A., Inc. I.P. Division

(57) ABSTRACT

A circuit board to be secured to a support member includes a first structure, a second structure, and a third structure. The first structure prevents the circuit board from moving in a horizontal direction with respect to the support member. The second structure prevents the circuit board from rotating around the first structure with respect to the support member. The third structure prevents the circuit board from moving in a vertical direction with respect to the support member. A distance between the first structure and the second structure is shorter than a distance between the first structure and the third structure.

8 Claims, 5 Drawing Sheets

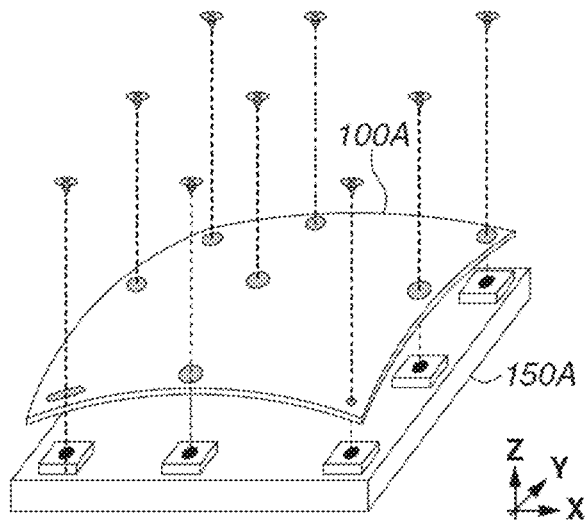
FIG.1A Prior Art
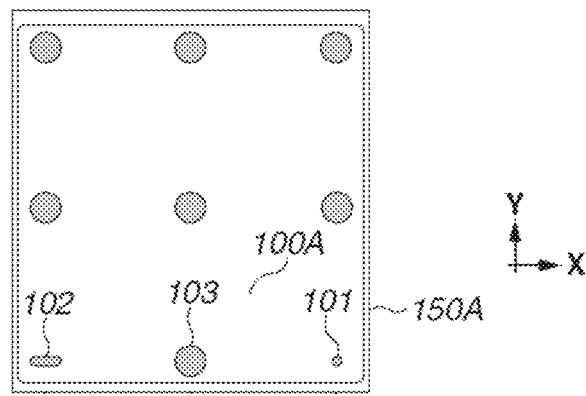
FIG.1B Prior Art
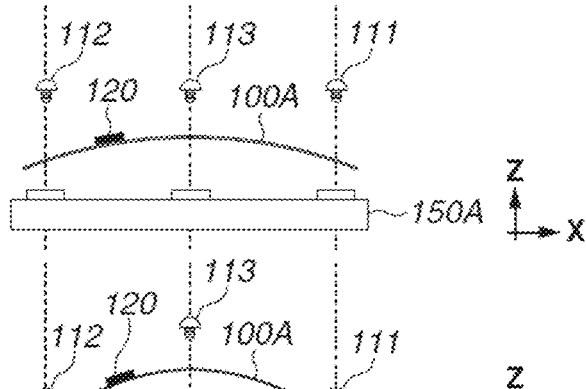
FIG.1C Prior Art
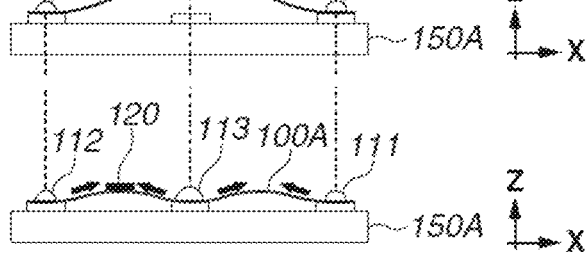
FIG.1D Prior Art
FIG.1E Prior Art

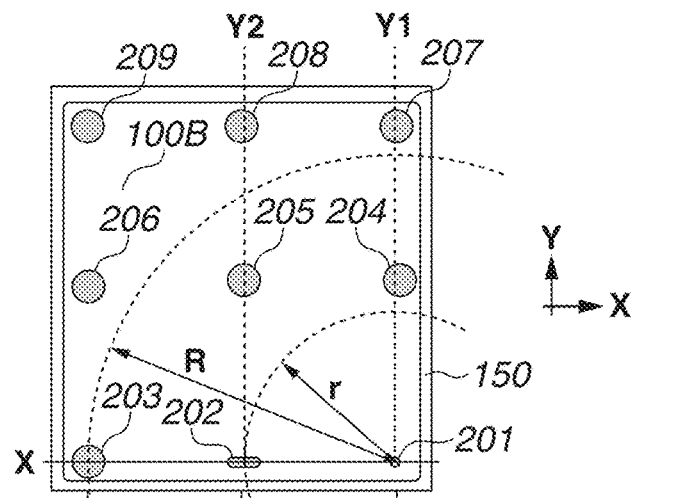
FIG.2A
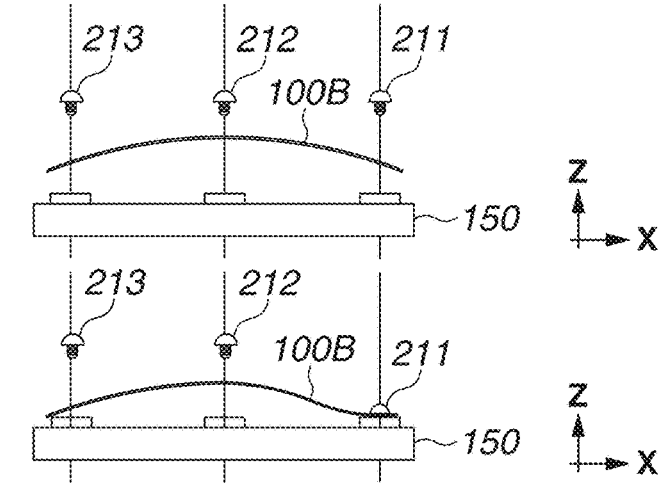
FIG.2B
FIG.2C
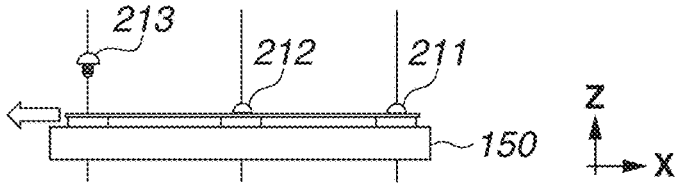
FIG.2D
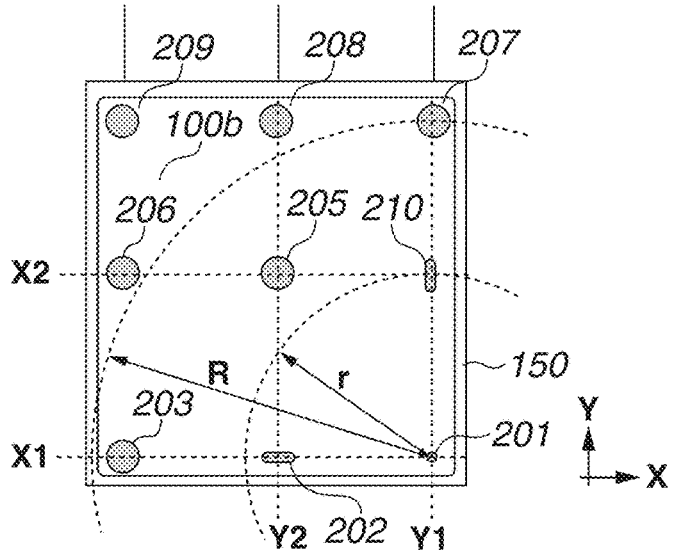
FIG.2E

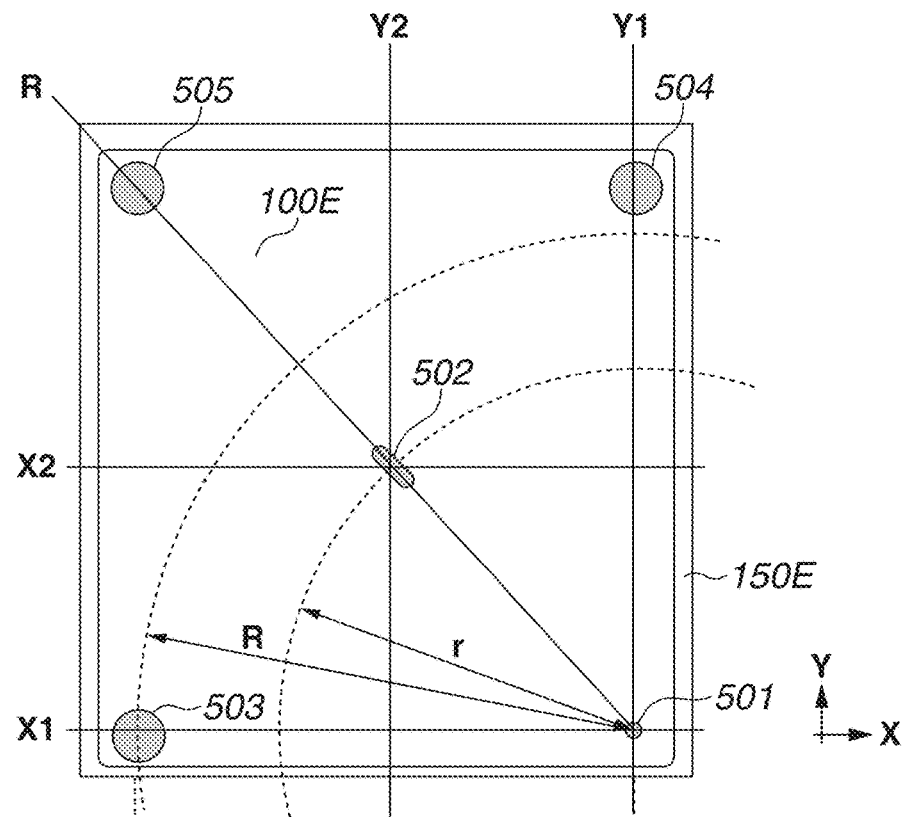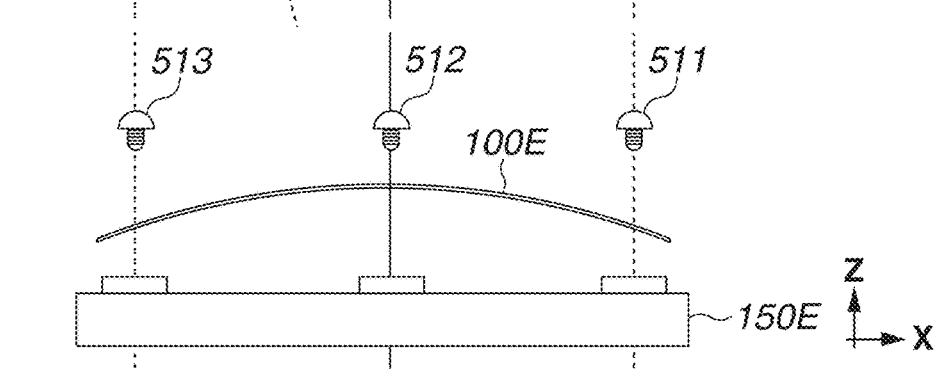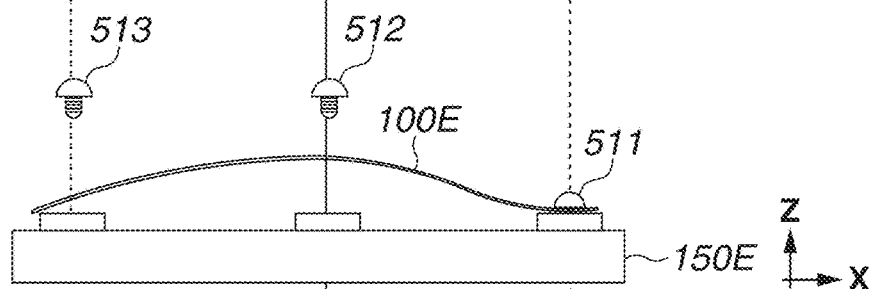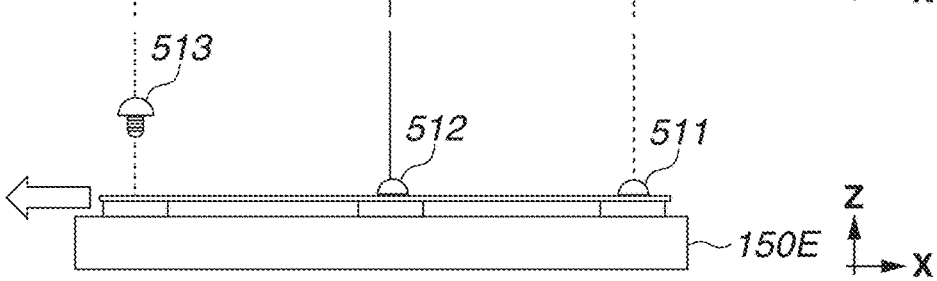

CIRCUIT BOARD

BACKGROUND

Field

The present disclosure relates to circuit boards.

Description of the Related Art

The recent increase in miniaturization and precision of parts mounted on circuit boards has involved the formation of a number of wiring patterns and vias in narrow regions, with smaller diameters of via sizes. The formation of smaller diameter vias is accompanied by using thinner drills, resulting in thinner boards employed due to limited penetration forces produced by the thinner drills. On the other hand, the demand for high-speed signal transmission, which involves the formation of impedance control patterns, has been growing.

Thinner boards are more beneficial to pattern forming on multilayer circuit boards, which strengthens the tendency toward thinner boards. Thinner boards can bend in mounting parts thereon with heat depending on the ratio of inner layer copper foil and the layout of parts. Many circuit boards, which are in electronic devices, are secured to support members for use (Japanese Patent Application Laid-Open No. 2019-179788).

FIGS. 1A to 1E illustrate an example of a sequence for securing a circuit board to a rigid support member with fastening members such as screws.

FIG. 1A is a perspective view illustrating a sequence for securing a printed circuit board 100A to a support member 150A. The support member 150A has a plane that spreads along a plane provided with the X and Y axes perpendicularly intersecting with each other. The direction perpendicular to the plane with the X and Y axes is the Z-axis direction. The printed circuit board 100A has a plurality of holes. Each screw is inserted into and fastened to the corresponding threaded hole in the support member 150A. As described above, the printed circuit board 100A is bent.

FIG. 1B illustrates the printed circuit board 100A and the support member 150A of FIG. 1A viewed from the Z-axis direction. The relative position between the printed circuit board 100A and the support member 150A is determined by a plurality of screws being fastened to the support member 150A. For example, referring to FIG. 1B, three holes having shapes different from one another are formed in the printed circuit board 100A. These holes will be described on the premise that the printed circuit board 100A is not bent. In the printed circuit board 100A, a hole 101 has approximately the same diameter as that of the threaded portion of a corresponding screw, an oblong hole 102 has a lateral length approximately the same as the diameter of the hole 101, and a hole 103 has a larger area than the hole 101.

First, a screw is fastened to the support member 150A in the hole 101 to restrict the movement of the printed circuit board 100A in the X- and Y-axis directions. Hereinafter, the hole 101 having approximately the same diameter as that of the screw threaded portion of a corresponding screw is referred to as an XY direction restricting hole 101. However, the single XY direction restricting hole 101 cannot restrict the rotational movement of the printed circuit board 100A around the XY direction restricting hole 101. To restrict the rotation movement of the printed circuit board 100A, another screw is fastened to the support member 150A in the oblong hole 102. The oblong hole 102 is referred to as a rotation restricting hole 102. As above mentioned, the screws fastened to the support member 150A in the XY direction restricting hole 101 and the rotation restricting hole 102, respectively, determines the relative position between the printed circuit board 100A and the support member 150A in the XY axis plane. Then, another screw is properly fastened to the support member 150A in the hole 103 having a larger area than the hole 101, making the distance between the support member 150A and the printed circuit board 100A in the Z-axis direction approximately zero, determining the relative position between the printed circuit board 100A and the support member 150A in the Z-axis direction. The hole 103 having a larger area than the hole 101 is referred to as a Z-direction restricting hole 103. In this way, the relative positions between the support member 150A and the printed circuit board 100A in the X-, Y-, and Z-axis directions are determined.

However, the printed circuit board 100A is bent, as described above. FIG. 1C illustrates the printed circuit board 100A and the support member 150A before screws are fastened as viewed in the Y-axis direction. FIG. 1D illustrates a state where screws have been fastened in the XY direction restricting hole 101 and the rotation restricting hole 102. The screws 111 and 112 fastened there determines the relative position between the printed circuit board 100A and the support member 150A in the XY axis plane but the position in the Z-axis direction, with which the printed circuit board 100A remains bent in the Z-axis direction. FIG. 1E illustrates a state where a screw 113 has been fastened in the Z-direction restricting hole 103 in this state. The screw fastened without correcting the bend in the printed circuit board 100A exerts a compressing force on the printed circuit board 100A in the X- and Y-axis directions (directions of the black arrows). However, since, in a part 120 mounted on the printed circuit board 100A, the force to maintain its shape is produced, the compressing force exerted on the printed circuit board 100A are applied on the soldered portion that secures the part 120 to the circuit board 100A. This poses an issue of solder crack induction.

SUMMARY

The present disclosure is directed to providing a structure allowing a circuit board to be secured while correcting the bend of the circuit board.

According to an aspect of the present disclosure, a circuit board configured to be secured to a support member includes a first structure configured to prevent the circuit board from moving in a horizontal direction with respect to the support member, a second structure configured to prevent the circuit board from rotating around the first structure with respect to the support member, and a third structure configured to prevent the circuit board from moving in a vertical direction with respect to the support member. A distance between the first structure and the second structure is shorter than a distance between the first structure and the third structure.

Further features of the present disclosure will become apparent from the following description of exemplary embodiments with reference to the attached drawings.

BRIEF DESCRIPTION OF THE DRAWINGS

FIGS. 1A to 1E illustrate a conventional printed circuit board and a conventional support member.

FIGS. 2A to E illustrate a printed circuit board and a support member according to a first and a second exemplary embodiment.

FIGS. 5A to 5D illustrate a printed circuit board and a support member according to a sixth exemplary embodiment.

DESCRIPTION OF THE EMBODIMENTS

Figure 3A:
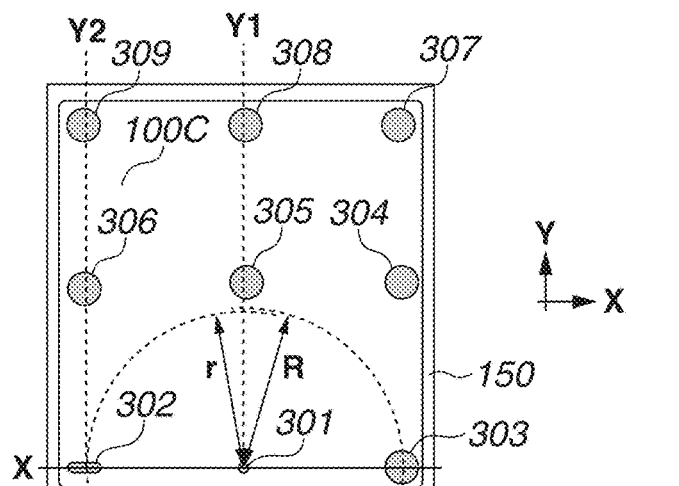
FIGS. 3A to 3E illustrate a printed circuit board and a support member according to a third and a fourth exemplary embodiment.

The arrangements of holes formed to secure a printed circuit board to a support member have no conditions but the shape of the printed circuit board and parts to be mounted on the printed circuit board. It is assumed that printed circuit boards according to the following exemplary embodiments have a convex bend in the Z-axis direction.

FIG. 2A is a plan view illustrating a printed circuit board 100B and a support member 150 according to a first exemplary embodiment.

The printed circuit board 100B according to the first exemplary embodiment is a multi-layered circuit board having a plurality of layers with metal patterns formed thereon. The printed circuit board 100B may be a single-layered circuit board. The printed circuit board 100B is provided with vias that electrically connect plural layers.

The printed circuit board 100B according to the first exemplary embodiment has a hole 201 as a first structure that prevents the printed circuit board 100B from moving in the horizontal direction (X- and Y-axis directions) with respect to the support member 150. The printed circuit board 100B also has a hole 202 as a second structure that prevents the printed circuit board 100B from rotating around the hole 201. The printed circuit board 100B also has holes 203 to 209 as structures that prevent the printed circuit board 100B from moving in the Z-axis direction (vertical direction of the printed circuit board 100B) with respect to the support member 150.

The screws to be fastened to the screw holes of the support member 150 are put in the above-described holes 201 to 209.

According to the first exemplary embodiment, the securing holes 201 to 209 are formed approximately at the four corners of the printed circuit board 100B, approximately at the center of each side of the printed circuit board 100B, and approximately at the center of the printed circuit board 100B. The center of each of the holes other than the hole 205 at the center of the printed circuit board 100B is apart from the corresponding edge of the printed circuit board 100B at a certain distance.

According to the first exemplary embodiment, the XY direction restricting hole 201 is formed at one of the four corners of the printed circuit board 100B.

FIGS. 2B to 2D illustrate a time sequence for securing the printed circuit board 100B to the support member 150.

The printed circuit board 100B is provided with the XY direction restricting hole 201 having approximately the same diameter as that of the screw threaded portion of a corresponding screw, the rotation restricting hole 202 in an oblong hole having a lateral length approximately the same as the diameter of the hole 201, and each of the Z-direction restricting holes 203 to 209 having a larger area than the hole 201.

As illustrated in FIG. 2A, the XY direction restricting hole 201 is formed at one right-hand corner of the printed circuit board 100B. The rotation restricting hole 202 is formed on the straight line X that passes through the center of the XY direction restricting hole 201 and extends in the X-axis direction. On the straight line X, no hole for securing the printed circuit board 100B is formed between the rotation restricting hole 202 and the XY direction restricting hole 201. The major axis of the rotation restricting hole 202 is parallel to the X-axis direction, and the minor axis thereof is parallel to the Y-axis direction.

The XY direction restricting hole 201, the rotation restricting hole 202, and the Z-direction restricting hole 203 are formed on the straight line X1 in this order.

The straight line Y1 passes through the center of the XY direction restricting hole 201 and is parallel to the Y-axis direction. The straight line Y2 passes through the center of the rotation restricting hole 202 and is parallel to the Y-axis direction. According to the first exemplary embodiment, no Z-direction restricting hole for securing the printed circuit board 100B has a center formed in the region between the straight lines Y1 and Y2.

The Z-direction restricting hole 203 is formed at one left corner of the printed circuit board 100B. The Z-direction restricting hole 203 is formed on the straight line X. A distance r denotes the distance between the center of the XY direction restricting hole 201 and the center of the rotation restricting hole 202. A distance R denotes the distance between the center of the XY direction restricting hole 201 and the center of the Z-direction restricting hole 203. The distances r and R have a relation r<R. On the straight line X, the XY direction restricting hole 201 is adjacent to the rotation restricting hole 202.

A method for securing the printed circuit board 100B to the support member 150 will be described with reference to FIGS. 2B to 2D. A screw 211 is fastened to the threaded hole of the support member 150 in the XY direction restricting hole 201. Thus, the printed circuit board 100B and the support member 150 in this state are illustrated in FIG. 2C. Then, a screw 212 is fastened to the threaded hole of the support member 150 in the rotation restricting hole 202. Thus, the printed circuit board 100B and the support member 150 in this state are illustrated in FIG. 2D. In the state of FIG. 2C, the printed circuit board 100B is able to slide in the X-axis direction. When the screw 212 is fastened to the threaded hole of the support member 150 in the rotation restricting hole 202, the length in the Z-direction with a bend in the printed circuit board 100B is changed to the length that extends the circuit board 100B in the X-axis direction (direction of the white arrow). As a result, the bend of the printed circuit board 100B is corrected. In this state, before a screw 213 is fastened to the threaded hole of the support member 150 in the Z-direction restricting hole 203, the bend of the printed circuit board 100B has already been corrected. As illustrated in FIG. 2D, the printed circuit board 100B is securable to the support member 150 with no compressing force produced on the circuit board 100B. Then, each screw is fastened to the corresponding threaded hole of the support member 150 in each of the remaining holes 204 to 209 formed in the printed circuit board 100B.

A second exemplary embodiment will be descried. According to the first exemplary embodiment, the XY direction restricting hole 201 and the rotation restricting hole 202 are formed in the printed circuit board 100b under the condition r<R. According to the second exemplary embodiment, a rotation restricting hole 210 is formed on the straight line Y1 under the condition r<R, as illustrated in FIG. 2E, similarly to the first exemplary embodiment.

The XY direction restricting hole 201, the rotation restricting hole 202, and the Z-direction restricting hole 203 are formed on the straight line X1 in this order. The XY direction restricting hole 201, the rotation restricting hole 210, and the Z-direction restricting hole 207 are formed on the straight line Y1 in this order.

The straight line X1 passes through the center of the XY direction restricting hole 201 and is parallel to the X-axis direction. The straight line X2 passes through the center of the rotation restricting hole 210 and is parallel to the X-axis direction. The straight line Y1 passes through the center of the XY direction restricting hole 201 and is parallel to the Y-axis direction. The straight line Y2 passes through the center of the rotation restricting hole 202 and is parallel to the Y-axis direction. According to the second exemplary embodiment, no Z-direction restricting hole for securing the printed circuit board 100*b* has a center formed in the region between the straight lines X1 and X2 or Y1 and Y2.

According to the second exemplary embodiment, the bend of the printed circuit board 100*b* viewed from the X-axis direction is correctable by the screws being fastened to the XY direction restricting hole 201, the rotation restricting hole 210, and the Z-direction restricting hole 205 in this order.

As described above, according to the first exemplary embodiment and the second exemplary embodiment, the XY direction restricting hole 201 is disposed at one corner of the printed circuit boards 100B and 100*b*, respectively. Then, the rotation restricting holes 202 and 210 are disposed to satisfy the condition r<R. When the screws are fastened to the rotation restricting holes 202 and 210, the bend of the printed circuit boards 100B and 100*b* is corrected. Each screw is fastened in the corresponding hole of the Z-direction restricting holes with no bend in the printed circuit boards 100B and 100*b*. As a result, no compressing force is produced on the printed circuit boards 100B and 100*b*, reducing the risk of solder crack induction on parts mounted on the printed circuit boards 100B and 100*b*.

A third exemplary embodiment will be described. FIG. 3A is a plan view illustrating a printed circuit board 100C and a support member 150 according to the third exemplary embodiment.

The printed circuit board 100C according to the third exemplary embodiment has a hole 301 as a first structure that prevents the printed circuit board 100C from moving in the horizontal direction (X- and Y-axis directions) with respect to the support member 150. The printed circuit board 100C also has a hole 302 as a second structure that prevents the printed circuit board 100C from rotating around the hole 301. The printed circuit board 100B also has holes 303 to 309 as structures that prevent the printed circuit board 100B from moving in the Z-axis direction with respect to the support member 150.

According to the third exemplary embodiment, the securing holes 301 to 309 are formed approximately at the four corners of the printed circuit board 100C, approximately at the center of each side of the printed circuit board 100C, and approximately at the center of the printed circuit board 100C. The center of each of the holes other than the hole 305 at the center of the printed circuit board 100C is apart from the corresponding edge of the printed circuit board 100B at a certain distance.

According to the third exemplary embodiment, the XY direction restricting hole 301 is formed at the center of one of the sides of the printed circuit board 100C.

Figure 3B:
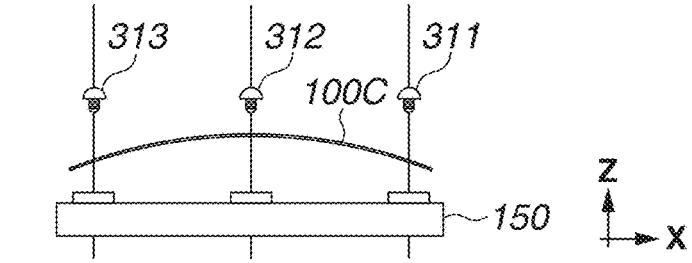
Figure 3C:
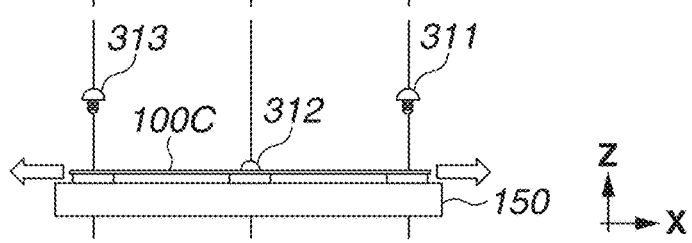
Figure 3D:
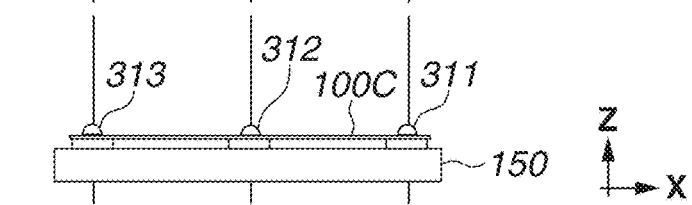

FIGS. 3B to 3D illustrate a time sequence for securing the printed circuit board 100C to the support member 150.

The printed circuit board 100C is provided with the XY direction restricting hole 301 having approximately the same diameter as that of the screw threaded portion of a corresponding screw, the rotation restricting hole 302 in an oblong hole having a lateral length approximately the same as the diameter of the hole 301, and each of the Z-direction restricting holes 303 to 309 having a larger area than the hole 301.

As illustrated in FIG. 3A, the XY direction restricting hole 301 is formed at the center of the bottom side of the printed circuit board 100C. The rotation restricting hole 302 is formed on the straight line X that passes through the center of the XY direction restricting hole 301 and extends in the X-axis direction. On the straight line X, no hole for securing the printed circuit board 100C is formed between the rotation restricting hole 302 and the XY direction restricting hole 301. The major axis of the rotation restricting hole 302 is parallel to the X-axis direction, and the minor axis thereof is parallel to the Y-axis direction.

The rotation restricting hole 302, the XY direction restricting hole 301, and the Z-direction restricting hole 303 are formed on the straight line X in this order.

The straight line Y1 passes through the center of the XY direction restricting hole 301 and is parallel to the Y-axis direction. The straight line Y2 passes through the center of the rotation restricting hole 302 and is parallel to the Y-axis direction. According to the third exemplary embodiment, no Z-direction restricting hole formed for securing the printed circuit board 100C has a center formed in the region between the straight lines Y1 and Y2.

The Z-direction restricting hole 303 is formed at one right-hand corner of the printed circuit board 100C. The Z-direction restricting hole 303 is formed on the straight line X. A distance r denotes the distance between the center of the XY direction restricting hole 301 and the center of the rotation restricting hole 302. A distance R denotes the distance between the center of the XY direction restricting hole 301 and the center of the Z-direction restricting hole 303. The distances r and R have a relation r<R.

A method for securing the printed circuit board 100C to the support member 150 will be described with reference to FIGS. 3B to 3D. First, a screw 312 is fastened to the threaded hole of the support member 150 in the XY direction restricting hole 301. The printed circuit board 100C and the support member 150 in this state are illustrated in FIG. 3C. Then, a screw 313 is fastened to the threaded hole of the support member 150 in the rotation restricting hole 302. A screw 311 is fastened to the threaded hole of the support member 150 in the Z-direction restricting hole 303. The printed circuit board 100C and the support member 150 in this state are illustrated in FIG. 3D. In the state of FIG. 3C, with no screw fastened to the rotation restricting hole 302 or the Z-direction restricting hole 303, the printed circuit board 100C is able to slide in the X-axis direction. When the screw 312 is fastened to the threaded hole of the support member 150 in the XY direction restricting hole 301, the length in the Z direction with a bend of the printed circuit board 100C is changed to the length that extends the circuit board 100C in the X-axis direction (directions of the white arrows), correcting the bend of the printed circuit board 100C. In this state, before the screw 313 and the screw 311 are fastened in the rotation restricting hole 302 and in the Z-direction restricting hole 303, respectively, the bend of the printed circuit board 100C has already been corrected. Thus, the printed circuit board 100C is securable to the support member 150 with no compressing force produced on the printed circuit board 100C, as illustrated in FIG. 3D. Then, each screw is fastened to the corresponding threaded hole of the support member 150 in each of the remaining holes 304 to 309 formed in the printed circuit board 100C.

Figure 3E:
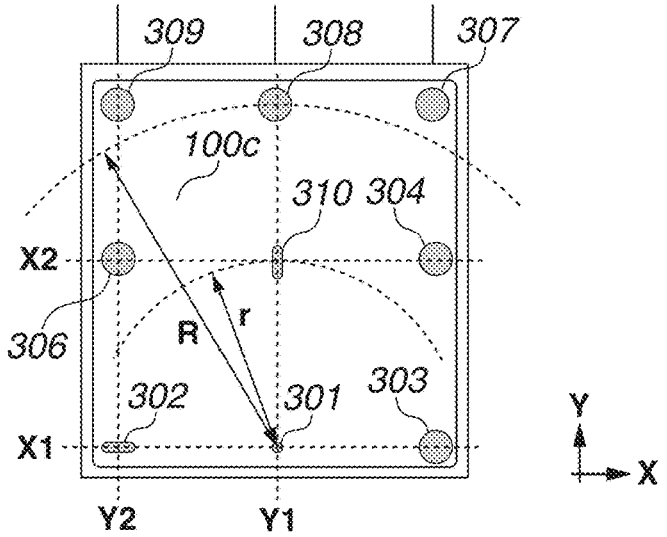

A fourth exemplary embodiment will be described. According to the third exemplary embodiment, the XY direction restricting hole 301 and the rotation restricting hole 302 are formed in the printed circuit board 100C under the condition r<R. According to the fourth exemplary embodiment, a rotation restricting hole 310 is formed on the straight line Y1 while satisfying the condition r<R, as illustrated in FIG. 3E. According to the fourth exemplary embodiment, the rotation restricting hole 302 is also formed on the straight line X in the printed circuit board 100c under the condition r<R, similarly to the third exemplary embodiment.

The rotation restricting hole 302, the XY direction restricting hole 301, and the Z-direction restricting hole 303 are formed on the straight line X1 in this order. The XY direction restricting hole 301, the rotation restricting hole 310, and the Z-direction restricting hole 308 are formed on the straight line Y1 in this order.

The straight line X1 passes through the center of the XY direction restricting hole 301 and is parallel to the X-axis direction. The straight line X2 passes through the center of the XY direction restricting hole 310 and is parallel to the X-axis direction. The straight line Y1 passes through the center of the XY direction restricting hole 301 and is parallel to the Y-axis direction. The straight line Y2 passes through the center of the rotation restricting hole 302 and is parallel to the Y-axis direction. According to the fourth exemplary embodiment, no Z-direction restricting hole for securing the printed circuit board 100c has a center formed in the region between the straight lines X1 and X2 or Y1 and Y2.

According to the fourth exemplary embodiment, a bend of the printed circuit board 100c viewed from the X-axis direction is correctable by the screws being fastened to the XY direction restricting hole 301, the rotation restricting hole 310, and the Z-direction restricting hole 308 in this order.

As described above, according to the third exemplary embodiment and fourth exemplary embodiment, the XY direction restricting hole 301 is disposed at the center of one of the sides of the printed circuit board 100. Then, the rotation restricting holes 302 and 310 are disposed to satisfy the condition r<R. Before each screw is fastened in the corresponding hole of the rotation restricting holes 302 and 310, the bend of the printed circuit boards 100C and 100c has been corrected. Each screw is fastened in the corresponding hole of the Z-direction restricting holes with no bend in the printed circuit boards 100C and 100c. As a result, no compressing force is produced on the printed circuit boards 100C and 100c, reducing the risk of solder crack induction on parts mounted on the printed circuit boards 100C and 100c.

Figure 4A:
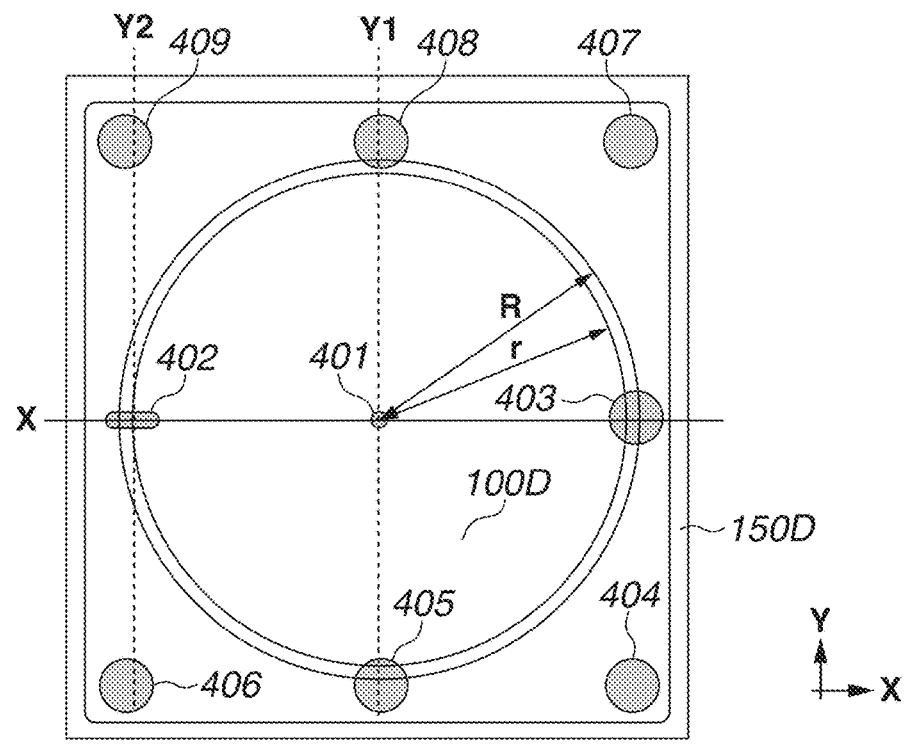
FIGS. 4A to 4D illustrate a printed circuit board and a support member according to a fifth exemplary embodiment.

A fifth exemplary embodiment will be described. FIG. 4A is a plan view illustrating a printed circuit board 100D and a support member 150D according to the fifth exemplary embodiment.

The printed circuit board 100D according to the fifth exemplary embodiment has a hole 401 as a first structure that prevents the printed circuit board 100D from moving in the horizontal direction (X- and Y-axis directions) with respect to the support member 150D. The printed circuit board 100D also has a hole 402 as a second structure that prevents the printed circuit board 100D from rotating around the hole 401. The printed circuit board 100D also has holes 403 to 409 as structures that prevent the printed circuit board 100D from moving in the Z-axis direction with respect to the support member 150D.

According to the fifth exemplary embodiment, the securing holes 401 to 409 are formed at the four corners of the printed circuit board 100D, at the center of each side of the printed circuit board 100D, and at the center of the printed circuit board 100D. The center of each of the holes other than the hole 401 at the center of the printed circuit board 100D is apart from the corresponding edge of the printed circuit board 100D at a certain distance.

According to the fifth exemplary embodiment, the XY direction restricting hole 401 is formed at the center of the printed circuit board 100D.

Figure 4B:
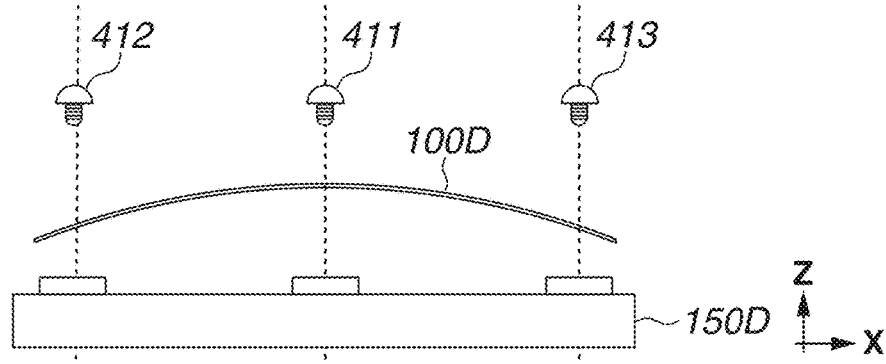
Figure 4C:
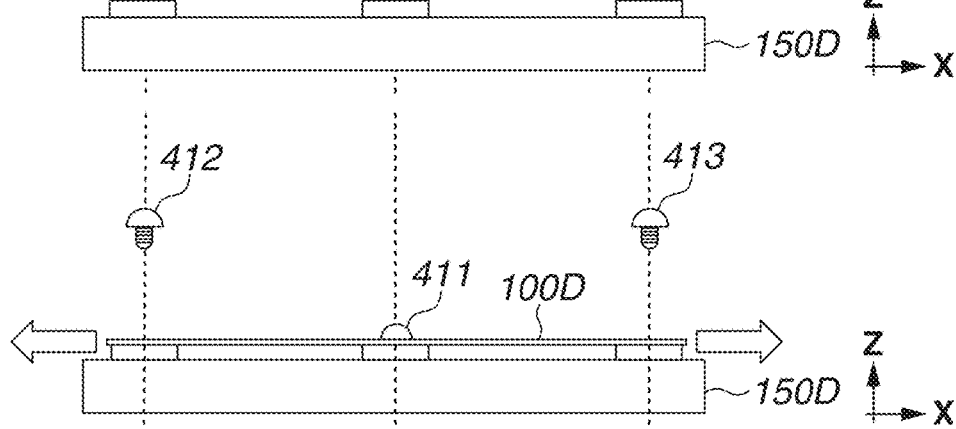
Figure 4D:
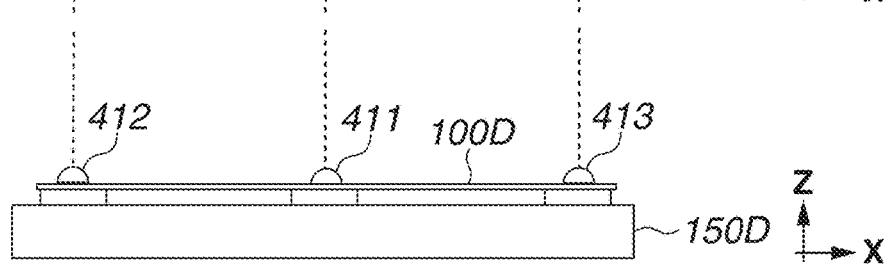

FIGS. 4B to 4D illustrate a time sequence for securing the printed circuit board 100D to the support member 150D.

The printed circuit board 100D is provided with the XY direction restricting hole 401 having approximately the same diameter as that of the screw threaded portion of a corresponding screw, the rotation restricting hole 402 in an oblong hole having a lateral length approximately the same as the diameter of the hole 401, and each of the Z-direction restricting holes 403 to 409 having a larger area than the hole 401.

As illustrated in FIG. 4A, the XY direction restricting hole 401 is formed at the center of the printed circuit board 100D. The rotation restricting hole 402 is formed on the straight line X that passes through the center of the XY direction restricting hole 401 and extends in the X-axis direction. On the straight line X, no hole for securing the printed circuit board 100D is formed between the rotation restricting hole 402 and the XY direction restricting hole 401. The major axis of the rotation restricting hole 402 is parallel to the X-axis direction, and the minor axis thereof is parallel to the Y-axis direction.

The rotation restricting hole 402, the XY direction restricting hole 401, and the Z-direction restricting hole 403 are formed on the straight line X in this order.

The straight line Y1 passes through the center of the XY direction restricting hole 401 and is parallel to the Y-axis direction. The straight line Y2 passes through the center of the rotation restricting hole 402 and is parallel to the Y-axis direction. According to the fifth exemplary embodiment, no Z-direction restricting hole for securing the printed circuit board 100D has a center formed in the region between the straight lines Y1 and Y2.

Also, the Z-direction restricting hole 403 is formed on the straight line X. A distance r denotes the distance between the center of the XY direction restricting hole 401 and the center of the rotation restricting hole 402. A distance R denotes the distance between the center of the XY direction restricting hole 401 and the center of the Z-direction restricting hole 403. The distances r and R have a relation r<R.

A method for securing the printed circuit board 100D to the support member 150D will be described with reference to FIGS. 4B to 4D. First, a screw 411 is fastened to the threaded hole of the support member 150D in the XY direction restricting hole 401. The printed circuit board 100D and the support member 150D in this state are illustrated in FIG. 4C. Then, a screw 412 is fastened to the threaded hole of the support member 150D in the rotation restricting hole 402. Then, a screw 413 is fastened to the threaded hole of the support member 150D in the Z-direction restricting hole 403. The printed circuit board 100D and the support member 150D in this state are illustrated in FIG. 4D. In the state in FIG. 4C, with no screw fastened to the rotation restricting hole 402 or the Z-direction restricting hole 403, the printed circuit board 100D is able to slide in the X-axis direction. When the screw 411 is fastened to the threaded hole of the support member 150D in the XY direction restricting hole 401, the length in the Z direction with a bend of the printed circuit board 100D is changed to the length that extends the circuit board 100D in the X-axis direction (directions of the white arrows), correcting the bend of the printed circuit board 100D. In this state, before the screw 412 and the screw 413 are fastened in the rotation restricting hole 402 and the Z-direction restricting hole 403, respectively, the bend of the printed circuit board 100D has already been corrected. Thus, the printed circuit board 100D is securable to the support member 150D with no compressing force produced on the printed circuit board 100D, as illustrated in FIG. 4D. Then, each screw is fastened to the corresponding threaded hole of the support member 150D in each of the remaining holes 404 to 409 formed in the printed circuit board 100D.

A sixth exemplary embodiment will be described. FIG. 5A is a plan view illustrating a printed circuit board 100E and a support member 150E according to the sixth exemplary embodiment.

The printed circuit board 100E according to the sixth exemplary embodiment has a hole 501 as a first structure that prevents the printed circuit board 100E from moving in the horizontal direction (X- and Y-axis directions) with respect to the support member 150E. The printed circuit board 100E also has a hole 502 as a second structure that prevents the printed circuit board 100E from rotating around the hole 501. The printed circuit board 100E also has holes 503 to 505 as structures that prevent the printed circuit board 100E from moving in the Z-axis direction with respect to the support member 150E.

According to the sixth exemplary embodiment, the securing holes 501 to 505 are formed at the four corners of the printed circuit board 100E and at the center of the printed circuit board 100E. The center of each of the holes other than the hole 502 at the center of the printed circuit board 100E is apart from the corresponding edge of the printed circuit board 100E at a certain distance. According to the sixth exemplary embodiment, the rotation restricting hole 502 is disposed not at any edge of the printed circuit board 100E but approximately at the center of the printed circuit board 100E.

FIGS. 5B to 5D illustrate a time sequence for securing the printed circuit board 100E to the support member 150E.

The printed circuit board 100E is provided with the XY direction restricting hole 501 having approximately the same diameter as that of the screw threaded portion of a corresponding screw, the rotation restricting hole 502 in an oblong hole having a lateral length approximately the same as the diameter of the hole 501, and each of the Z-direction restricting holes 503 to 509 having a larger area than the hole 501.

As illustrated in FIG. 5A, the XY direction restricting hole 501 is formed at one corner of the printed circuit board 100E. The rotation restricting hole 502 is formed on the straight line R that passes through the center of the XY direction restricting hole 501. The straight line R is a diagonal of the printed circuit board 100E. On the straight line R, no hole for securing the printed circuit board 100E is formed between the rotation restricting hole 502 and the XY direction restricting hole 501. The major axis of the rotation restricting hole 502 is parallel to straight line R, and the minor axis thereof is parallel to the direction perpendicularly intersecting the straight line R.

The XY direction restricting hole 501, the rotation restricting hole 502, and the Z-direction restricting hole 505 are formed on the straight line R in this order.

The straight line Y1 passes through the center of the XY direction restricting hole 501 and is parallel to the Y-axis direction. The straight line Y2 passes through the center of the rotation restricting hole 502 and is parallel to the Y-axis direction. According to the sixth exemplary embodiment, no Z-direction restricting hole for securing the printed circuit board 100E has a center formed in the region between the straight lines Y1 and Y2.

The straight line X1 passes through the center of the XY direction restricting hole 501 and is parallel to the X-axis direction. The straight line X2 passes through the center of the rotation restricting hole 502 and is parallel to the X-axis direction. According to sixth exemplary embodiment, no Z-direction restricting hole for securing the printed circuit board 100E has a center formed in the region between the straight lines X1 and X2.

A plurality of the Z-direction restricting holes is formed at corners of the printed circuit board 100E. A distance r denotes the distance between the center of the XY direction restricting hole 501 and the center of the rotation restricting hole 502. A distance R denotes the distance between the center of the XY direction restricting hole 501 and the center of the Z-direction restricting hole 503. The distances r and R have a relation r<R.

A method for securing the printed circuit board 100E to the support member 150E will be described with reference to FIGS. 5B to 5D. First, a screw 511 is fastened to the threaded hole of the support member 150E in the XY direction restricting hole 501. The printed circuit board 100E and the support member 150E in this state are illustrated in FIG. 5C. Then, a screw 512 is fastened to the threaded hole of the support member 150E in the rotation restricting hole 502. The printed circuit board 100E and the support member 150E in this state are illustrated in FIG. 5D. Then, a screw 513 is fastened to the threaded hole of the support member 150E in the Z-direction restricting hole 505. In the state in FIG. 5C, with no screw fastened to the rotation restricting hole 502 or the Z-direction restricting hole 503, the printed circuit board 100E is able to slide in the X-axis direction. When the screw 512 is fastened to the threaded hole of the support member 150E in the rotation restricting hole 502, the length in the Z-direction with a bend of the printed circuit board 100E is changed to the length that extends the circuit board 100E in the X- and Y-axis directions, correcting the bend of the printed circuit board 100E. In this state, before the screw 513 is fastened in the rotation restricting hole 505, the bend of the printed circuit board 100E has already been corrected. Thus, the printed circuit board 100E is securable to the support member 150E with no compressing force produced on the printed circuit board 100E, as illustrated in FIG. 5D. Then, each screw is fastened to the corresponding threaded hole of the support member 150E in each of the remaining holes 503 and 504 formed in the printed circuit board 100E.

According to the sixth exemplary embodiment, with the rotation restricting hole 502 disposed approximately at the center of the printed circuit board 100E, the bend of the printed circuit board 100E is released in the X- and Y-axis directions simply by the screw 512 being fastened in the rotation restricting hole 502.

Modifications

The printed circuit boards according to the above-described exemplary embodiments are mounted on printers, scanners, personal computers (PCs), servers, and other electronic apparatuses.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-104673, filed Jun. 17, 2020, which is hereby incorporated by reference herein in its entirety.

What is claimed is:

1. A circuit board configured to be secured to a support member, the circuit board comprising:
    a first structure configured to prevent the circuit board from moving in a horizontal direction with respect to the support member;
    a second structure configured to prevent the circuit board from rotating around the first structure with respect to the support member; and
    a third structure configured to prevent the circuit board from moving in a vertical direction with respect to the support member,
    wherein at least one of the first structure, the second structure, or the third structure is a hole for inserting a screw to be fastened to the support member, and the second structure is an oblong hole having a major axis parallel to a straight line that passes through the first structure and the second structure, and
    wherein the third structure is located on the straight line, and the second structure is located between the first structure and the third structure.

2. The circuit board according to claim 1,
    wherein the circuit board is a multi-layered circuit board including a plurality of layers with metal patterns on the circuit board, and
    wherein a via for electrically connecting layers is in the circuit board.

3. The circuit board according to claim 1, wherein the first structure, the second structure, and the third structure each are a hole for inserting a screw to be fastened to the support member.

4. The circuit board according to claim 1, wherein the first structure, the second structure, and the third structure are on one straight line in this order.

5. The circuit board according to claim 4,
    wherein the one straight line is a diagonal of the circuit board, and
    wherein the first structure, the second structure, and the third structure are on the diagonal in this order.

6. The circuit board according to claim 1, wherein the first structure is at a corner of the circuit board.

7. The circuit board according to claim 1, wherein the third structure is at a corner of the circuit board.

8. The circuit board according to claim 1, wherein the circuit board comprises a plurality of third structures, each as the third structure.

* * * * *